March 28, 1967 K. EHRAT ETAL 3,310,867

METHOD AND A JIG FOR ASSEMBLING A PLURALITY
OF WIRE-ENDED, ELECTRICAL COMPONENTS
INTO A MODULE

Filed Nov. 30, 1964 5 Sheets-Sheet 1

Inventors
Kurt Ehrat
Dieter Eckstein

By Pierce Scheffler & Parker
Attorneys

Inventors
Kurt Ehrat
Dieter Eckstein
By Pierce, Scheffler & Parker
Attorneys

March 28, 1967 K. EHRAT ETAL 3,310,867

METHOD AND A JIG FOR ASSEMBLING A PLURALITY OF WIRE-ENDED, ELECTRICAL COMPONENTS INTO A MODULE

Filed Nov. 30, 1964

5 Sheets-Sheet 3

Inventors

Kurt Ehrat
Dieter Eckstein

By Pierce, Scheffler & Parker
Attorneys

March 28, 1967 K. EHRAT ET AL 3,310,867

METHOD AND A JIG FOR ASSEMBLING A PLURALITY OF WIRE-ENDED, ELECTRICAL COMPONENTS INTO A MODULE

Filed Nov. 30, 1964 5 Sheets-Sheet 4

Inventors
Kurt Ehrat
Dieter Eckstein
By Pierce, Scheffler & Parker
Attorneys

March 28, 1967 K. EHRAT ETAL 3,310,867

METHOD AND A JIG FOR ASSEMBLING A PLURALITY OF WIRE-ENDED, ELECTRICAL COMPONENTS INTO A MODULE

Filed Nov. 30, 1964 5 Sheets-Sheet 5

Inventors
Kurt Ehrat
Dieter Eckstein
By Pierce, Scheffler & Parker
Attorneys

United States Patent Office 3,310,867
Patented Mar. 28, 1967

3,310,867
METHOD AND A JIG FOR ASSEMBLING A PLURALITY OF WIRE-ENDED, ELECTRICAL COMPONENTS INTO A MODULE

Kurt Ehrat, Zurich, and Dieter Eckstein, Birmensdorf, Switzerland, assignors to Gretag Aktiengesellschaft, Regensdorf, Switzerland Filed Nov. 30, 1964, Ser. No. 414,727
Claims priority, application Switzerland, Dec. 5, 1963, 14,931/63
8 Claims. (Cl. 29—155.5)

Figures 1, 9:
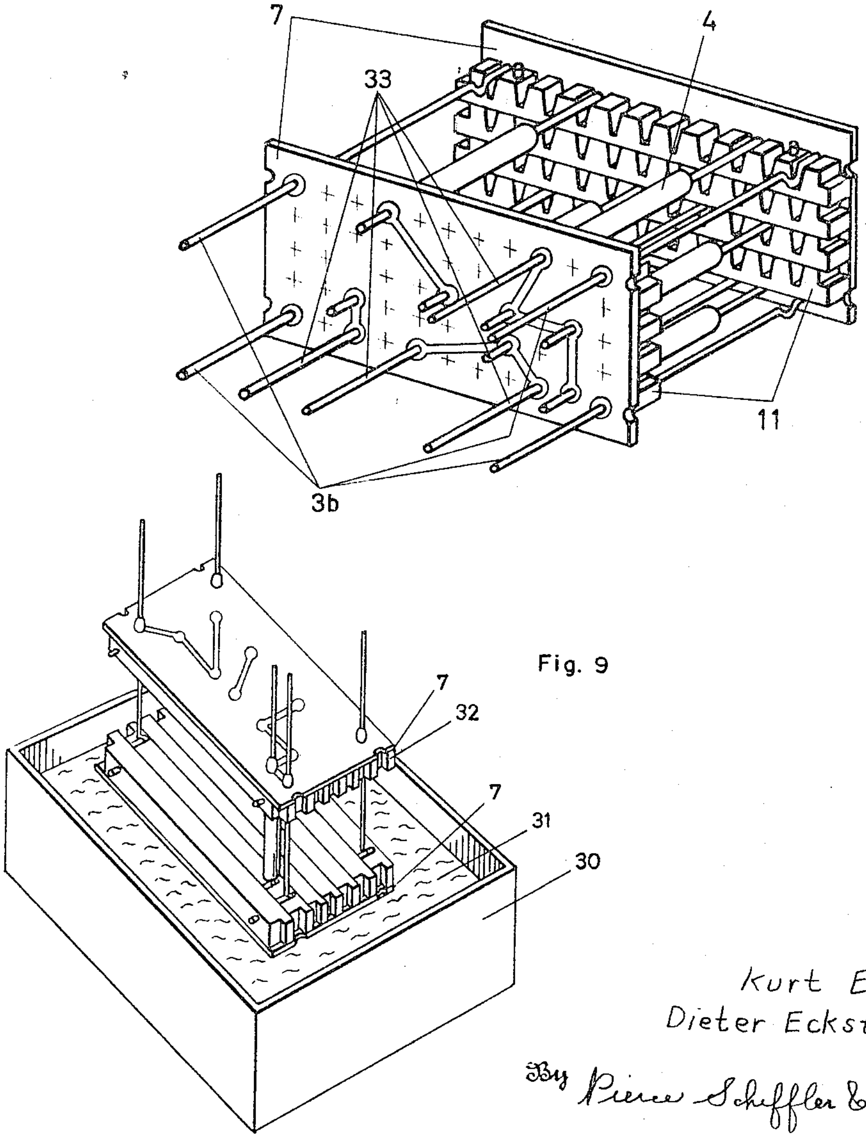

The present invention relates to a method and a jig for assembling a plurality of wire-ended, electrical components into a module.

In electrical communications, computer and control technology the volume of information that must be processed has steadily risen requiring larger capacity electronic devices to handle it. This in turn leads to design of the devices so as to have minimum weight and to occupy minimum space. The degree of miniaturisation of a circuit assembly is determined by its packaging density, that is to say by the number of components contained therein per unit of volume.

For achieving high packaging densities it has been proposed to combine the component elements in separate groups and to associate each group mounted on at least one insulating base with a printed circuit thereon to form a circuit module. Two methods of packaging which differ in principle have been developed. In one system the component elements in a module are arranged parallel to a printed circuit plate, whereas in the so-called "Cordwood technique" the components are arranged side by side between printed circuit plates in planes normal to the plates. Assuming that fairly well rationalised methods of production are employed the first mentioned technique cannot achieve packaging densities exceeding one component element per cubic centimetre. The "Cordwood technique" permits this density to be raised to between two and four component elements per cubic centimetre, provided that the elements are all, as nearly as possible, of the same size. This density can be substantially further improved by applying the technique to subminiaturised component assemblies.

In the otherwise advantageous "Cordwood technique" the threading of the connecting wires of the components into the printed circuit plate is a matter presenting some difficulty and a nuisance particularly in mass production. In one method of carrying this technique into effect, two parallel, fixed plates are provided with facing slots into which locating racks having notches forming a kind of comb structure can be inserted and stacked in tiers. After insertion of two corresponding locating racks, the connecting wire ends of the components intended for this tier are cut to equal lengths, and the wire ends of the components are placed into appropriate notches. The next to locating racks can then be inserted to rest upon the racks below them, the next tier of components placed into position and so fourth. When the top tier of component elements is in position the two stacks of locating racks are covered with a final bar and the conducting plates are pushed into place. To this end a backing-up plate which fits into two further slots in the two fixed plates is inserted parallel to the two stacks of locating racks to prevent the components from being displaced when the printed circuit plate is pushed on to the wire ends on the other side of the components. The same method is used for pushing on the second conductor plate. The assembled module is then provisionally fixed, lifted out of the guide slots and the locating racks are removed from the module by twisting them out of position.

This method involves a number of drawbacks. Since the holes in the printed circuit plates for the reception of the connecting wires of the components must not be much wider (about 0.2 mm.) than the diameter of the connecting wires to ensure the production of good soldered joints, the straightness of the connecting wires must be ensured. Unfortunately, the creation of minute bends is very difficult to avoid. The conventional method therefore provides the holes with flared entries, a necessity which considerably adds to the cost. Moreover, the use of printed circuit plates which are foil faced on both sides or of holes that are metallised throughout is impossible. Even the provision of the flared hole entries still necessitates extremely careful preparatory work and careful straightening of all the connecting wires of the component elements.

In this method the locating racks are stacked directly on top of one another, each one being supported by the rack below it. This requires the racks to be made to a high degree of accuracy because tolerances may be additive in the formation of stacks and it is therefore possible for the upper tiers to deviate considerably from the positions required to bring the wire ends of the supported components into alignment with the holes in the printed circuit plate. Hence, the locating racks must be accurately manufactured and this involves high costs. In relation to the value of a module thus constructed their value is certainly too high for the racks to be left in the finished module. Once the locating racks have been removed from the module it becomes impossible at a later stage to replace components that may be defective. If this occurs the entire module requires replacement. Another drawback is the fact that it is practically impossible to automate the above-described method.

According to one aspect of the present invention there is provided a method of assembling a plurality of wire-ended, electrical components into a module, which method includes the steps of positioning two notched, locating racks, opposite one another with their notches uppermost, placing a wire-ended, electrical component between said locating racks so that its wire ends lie in oppositely aligned notches, positioning two further, notched, locating racks, notches uppermost; placing a wire-ended, electrical component between said locating racks so that its wire ends lie in oppositely aligned notches; positioning two further, notched locating racks, notches uppermost, above the two first mentioned racks and spaced apart therefrom to form two stacks of racks; placing a further wire-ended electrical component between said two further locating racks so that its wire ends lie in oppositely aligned notches in said further racks; positioning an apertured mounting plate on that side of one stack facing away from the supported electrical components to receive in the apertures of said plate those wire ends supported in said one stack; and moving said mounting plate in the direction of said one stack until those wires ends supported in said one stack pass through the apertures in said mounting plate.

According to a second aspect of the present invention there is provided a jig for assembling a plurality of wire-ended, electrical components into a module in which, during assembly, the wire ends of the components are supported between two stacks of locating racks, the jig including a base member; a slide member movable along said base member; first guide means mounted on said slide member for supporting one of said stacks of locating racks, second guide means for supporting the other stack of racks, and support means associated with each guide means for individually supporting each rack of a stack.

Figures 2, 2A, 3A, 3B, 3C, 3D, 3E, 4:
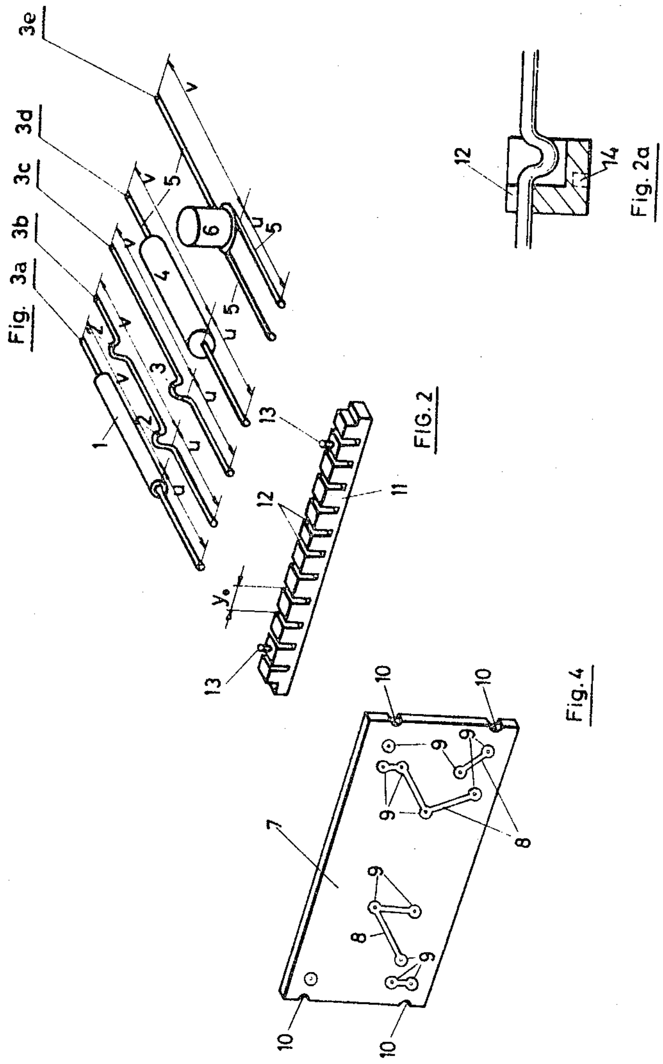
Figure 5:
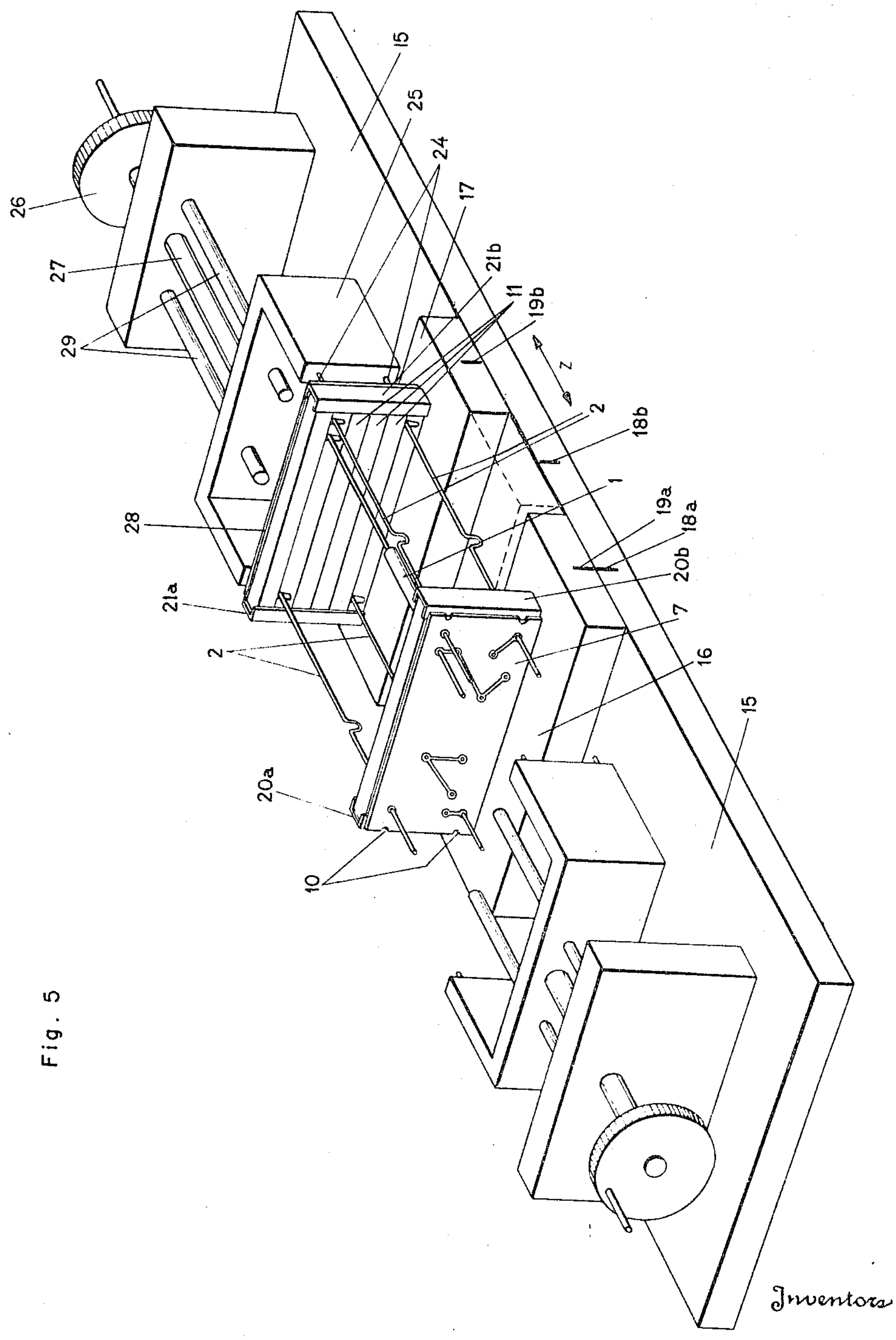
Figure 6:
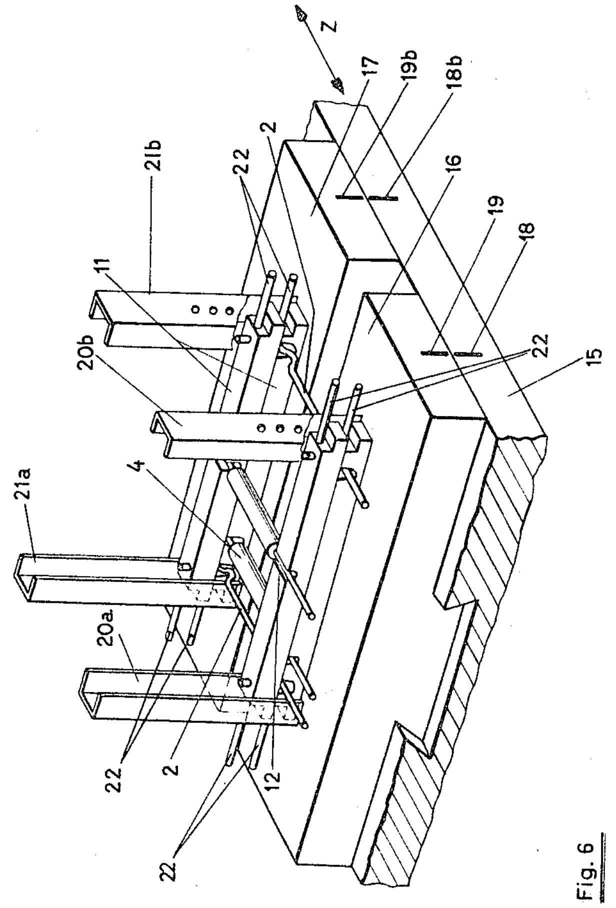
Figure 7:
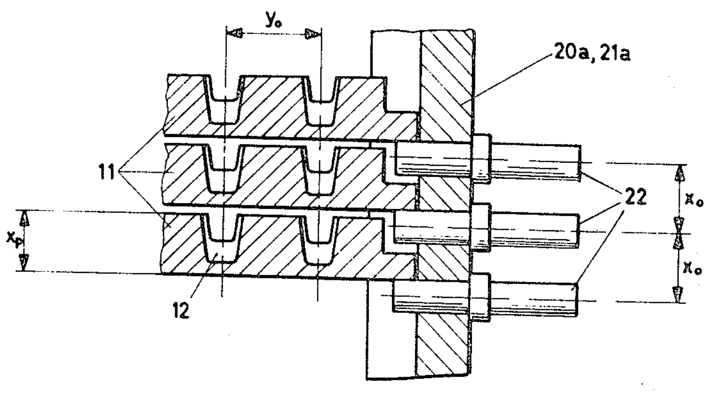
Figure 8:
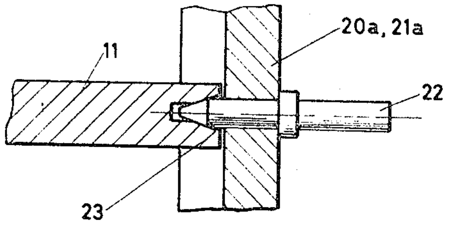

For a better understanding of the present invention and to show how the same may be carried into effect, reference will now be made to the accompanying drawings in which:

FIGURE 1 is a perspective view of an assembled and soldered module,

FIGURE 2 is a perspective view of a locating rack used in the module of FIGURE 1, FIGURE 2*a* is a cross-section through a notch in the locating rack of FIGURE 2, FIGURE 3*a* to 3*e* are views of components which may be assembled in a module, FIGURE 4 is a perspective view of, a mounting plate with a printed circuit thereon, FIGURE 5 is a perspective view of a simplified jig for assembling the module of FIGURE 1, FIGURE 6 is a sectional view showing in more detail part of the jig of FIGURE 5, FIGURES 7 and 8 show two ways of supporting the locating racks on the jig whilst assembling the module, and FIGURE 9 is a perspective drawing illustrating an immersion soldering process for soldering the module.

FIGURE 1 shows a completely assembled soldered module. The drawing shows two printed circuit plates 7, a plurality of locating racks 11, four corner stay wires **3*b* and several components 4. The wires 3*b*** can be regarded as components since they may be used as connecting wires.

By reference to FIGURES 2, 3*a* to 3*e*, and 4, the various parts which may be used in the construction of a module will first be described in detail.

FIGURE 2 is a preferred form of construction of a locating rack. The rack is made of insulating material and has notches 12 in the upper edge thereof forming a kind of comb structure, the spacing $y_o$ of the notches being preferably constant along the entire length of the rack. The principal object of the rack is to locate the components in order to facilitate the subsequent assembly of printed circuit plates. The racks also determine the relative spacing of the component elements and of the soldered joints on the printed circuit plates in such a way that the components will be protected from being excessively heated during the soldering operation. With the aid of two pins 13 on the top of each rack and corresponding holes 14 in the underside of each rack (FIG. 2*a*) the racks can be fitted together to form a stack. These pins 13 and holes 14 only serve to locate the racks with respect to each other. In the assembly of the module the racks are supported individually as is described below.

The notches 12 may be contrived in various ways. One arrangement is exemplified in FIG. 2*a* in which the racks have an L-shaped cross section through each notch. As illustrated this permits components with a wire end formed with a small semicircular kink to be accommodated within a minimum of space.

FIGURES 3*a* and 3*b* illustrate corner stay wires. These consist of a harder material than the connecting wires of the components and are intended to make the module more rigid against flexural distortion. Moreover, they provide protection for the other connecting wires. The corner stay wires have the additional purpose of correctly spacing the printed circuit plates. In the case of FIGURE 3*a* this is done with the aid of a spacing sleeve 1, whereas in FIGURE 3*b* the same result is achieved by providing the wire with two kinks 2. Naturally the corner wires may also function as connecting wires.

The other component elements used in the module are of conventional kind. FIGURES 3*c* to 3*e* illustrate a selection of component and auxiliary elements prepared for assembly.

FIGURE 3*c* is an ordinary connecting wire 3,

FIGURE 3*d* is a component 4 with axial connecting wires (such as a resistor, capacitor or diode).

FIGURE 3*e* is a transistor 6 with connecting wires 5 bent into appropriate positions for fitting in the module.

In all the components each connecting wire is so cut that for all components the distance *u* and *v* between one edge of a component and the ends of its connecting wires is constant. This one edge will hereinafter be referred to as the locating edge. The above is not true for the module shown in FIGURE 1 as will be explained later.

FIGURE 4 shows a printed circuit plate made of insulating material overlaid with copper foil to provide the circuit. This plate serves a mounting for the components and by means of its printed conductors it provides electrical connections between the components. The printed circuit consists of conducting strips 8 with eyelet ends 9 embracing holes. The edges of the conductor plates are provided with locating notches 10 for subsequent assembly.

By reference to FIGURES 5 to 9 the method of assembling the above described parts into a module using a jig will now be described in greater detail together with the construction of the jig.

FIGURE 5 is an overall perspective view of the jig. Mounted on a baseplate 15 are two slide members 16 and 17 each movable along the base plate in the direction *z* shown. These slide members have each mounted thereon a pair of U-section stacking rails **20*a*, 20*b*, and 21*a*, 21*b*** respectively for supporting the locating racks in the two stacks.

The two slide members are first moved into a position in which index marks **19*a* and 19*b* respectively on the members register with cooperating reference marks 18*a* and 18*b*** respectively on the baseplate. In this position the spacing of the two pairs of stacking rails equals that required for the locating racks in the assembled module.

This position is illustrated in FIGURE 6 which shows an enlarged fragmentary portion of the jig FIGURE 5. One locating rack 11 with its notches facing upwards is now placed into each pair of stacking rails **20*a*, 20*b* and 21*a*, 21*b* and the first tier of components is inserted, the locating edges of the component elements or the kinks being moved against the corresponding locating rack and the wire ends extending beyond the stacks of locating racks. In the illustrated example this tier comprises the two corner stay wires 42 and one component 4. Two further racks are positioned above the two already positioned racks. These further racks are not placed directly on top of the racks below them but are spaced apart therefrom by pins 22 inserted in holes 23 in the stacking rails so that each rack is individually supported. In this way the incorrect alignment of the wire-ends of the components with the apertures in the mounting plate is avoided. Such incorrect alignment might occur if the racks were placed with each rack supported by the one below it so that tolerances in the manufacture of each rack could add together to bring the upper tiers of components out of alignment with the printed circuit plates. In the present case the position of each rack is determined individually by the position of the holes 23** in the stacking rails. Thus the correct alignment of the pattern of wire ends to be received in the corresponding pattern of holes in the associated printed circuit plate is determined by the accuracy of the holes in the stacking rails.

The manner of individually supporting each rack is shown in FIGURES 7 and 8 in which parts of longitudinal sections of supported racks are illustrated. In FIGURE 7 the racks 11 are simply arranged to rest on pins 22 which are shown inserted in holes 23 in the stacking guide **20*a*. In FIGURE 8 they are more positively held as each rack 11 has a conical recess 23 at each end, into which a supporting pin 22 having a corresponding conical end is inserted. It can be seen from FIGURE 7 that the racks are held spaced apart, the height $x_p$ of the racks being slightly less than the spacing $x_o$ of two pins 22** ($x_p<x_o$). Though the spacing $x_o$ can be selected as required, because most of the components have a cylindrical shape it is convenient generally to make $x_o=y_o$ (FIG. 2).

When the module has been assembled with the aid of the pins 22 and, preferably, a final locating rack has been placed on the uppermost tier in each stack, the printed circuit plates can be threaded on to the wire ends. In this connection reference will first again be made to FIGURE 5 in which for the sake of simplyfying the drawing the supporting pins have been omitted. A carrier 25 mounted on the baseplate 15 is movable in direction $z$ by means of a hand wheel 26, a lead screw 27 and guide bars 29. This carrier has four pins 24 on to which a solid backing-up plate 28 is first fitted and moved to the left until all the right hand, projecting, wire ends bear against this plate. Slide 17 is then traversed towards the backing-up plate 28 until the clearance between the plate and the locating racks is very small and the wire ends just project from the stack of locating racks only a few tenths of a millimetre (it is possible to withdraw the ends of the wires into stacks providing, of course, that they do not disengage from the racks). This is illustrated in FIGURE 5, the right hand wire ends being shown much longer than they actually are for the sake of greater clarity. Carrier 25 is now retracted again and the backing-up plate 28 is replaced by a printed circuit plate 7 (FIG. 1). When the carrier is now advanced again the ends of the wires of the components will pass through the holes in the eyelets 9 of the printed circuit. The advance of the carrier 25 is continued so that the slide 17 is returned to its former position in which the index mark 19*b* of the slide registers with the reference mark 18*b* on baseplate 15. However, to ensure that this threading operation will proceed without trouble, it is essential that the printed circuit plate be precisely located on the carrier 25. To this end the notches 10 (FIG. 4) are provided on the printed circuit plate, these notches engaging the pins 24 to hold the plate in the required position.

The operation described for threading the right hand printed circuit plate onto the wires is now similarly performed on the other side of the assembly. In FIGURE 5 the left hand plate is shown already correctly threaded on to the wires with those connecting wires for subsequently wiring up the module in a larger assembly projecting from the plate.

When the module has thus been assembled the pins 22 are extracted and the module is lifted out of the stacking rails to be dipped into an immersion soldering bath to make the connections between the connecting wires and the printed circuits.

In order to prevent the module from coming apart when it is removed from the jig it is advisable to use a special tool which need not here be described. However, for the sake of simplicity a wire at each of two corner points of each printed circuit plate is first soldered by hand to the printed circuit so that the plates cannot shift when the module is lifted out.

The immersion soldering operation which, as such, is a known process, will nevertheless be briefly decribed by reference to FIGURE 9.

The immersion soldering bath consists of a metal container 30 in which the liquid solder 31 is raised to a temperature of 240° to 250° C. by heating means (not shown) in the floor of the bath. A thermostat (not shown) keeps the bath at this constant temperature. Before the assembled module 32 is dipped into the solder 31 the oxide skin thereon must be pushed aside with a knife blade. The module is dipped into the solder bath just far enough to wet the underside of one printed circuit plate 7. The soldering operation takes about 3 to 4 seconds to perform. The plate from which the long wire ends (of length $u$ in FIGS. 3*a* to 3*e*) project is dipped first, because in this position the bodies of all the components or the kinks in the wires will rest in the notches in the stacks of locating racks associated with this plate and their weight will therefore keep them in position during the soldering operation. The upper locating racks are held, by the kinks in the corner wires primarily by the engagement of the locating pins 13 and holes 14 of the locating racks themselves. When the other plate has been immersion-soldered in the same way all the wire ends not required for connections are cut off.

In order to connect the module into a larger assembly it is possible to make some of the wire ends, intended for further connections, longer than the others. As is illustrated in FIGURE 1 the stiff corner stay wires 3*b* as well as on the wires 33 for connecting up the module to a larger assembly are longer than the others connected to the left hand plate 7 so that they will project from the finished module for use as means of connection to a larger printed circuit.

In order to facilitate the wiring up of a module, the design of the printed circuits should be such that the spacing of the connections of the entire module is at least twice as large as the spacing $y_0$ of the notches in the locating racks or as the spacing $x_0$ of the supporting pins ($x \geqq 2x_0$, $y \geqq 2y_0$). The subsequent connection of the module to a larger plate with a printed circuit is made easier by using a stiffer material for the stay wires so that they will not be readily bent. The introduction of the module into a further printed circuit may also be assisted by making the length $u$ of the corner stay wires (FIGS. 3*a* and 3*b*) a little longer than that of the other components.

When the module has been soldered the top and bottom locating racks are unnecessary, so that the finished module will have the form shown in FIGURE 1. If in subsequent use the module is likely to be exposed to major temperature fluctuations and the problem of space is not critical, it is advisable to provide additional expansion loops or kinks in the connecting wires on that side of the components which faces away from their locating edge. Undesirable thermal stresses and strains which might otherwise affect the components can thus be taken up in the loops or kinks.

The method of assembling modules described above is one that is relatively easily automated and can be controlled by reference to a programme.

As has already been indicated a module assembled as described above is so arranged that components in it can be replaced. For example, should it be necessary to replace a defective component, the printed circuit plate connected to the shorter wire ends (of length $v$ in FIGS. 3*a* to 3*e*) can first be disconnected by melting the solder of the connections thereon in the immersion soldering bath. The associated stack can then be separated at the required tier and the defective component exchanged after its soldered connection at the opposite conductor plate has been likewise melted. Owing to the mutual engagement of the pins 13 and the holes 14 (FIGS. 2, 2*a*) the module cannot fall apart and all the wire ends are therefore retained in their notches. The stack can then be re-assembled, the printed circuit plate replaced and the module resoldered.

It is to be noted that the described module may be embedded in a castable resin, silicone rubber or in some similar insultating material. However, if this is done the advantage of the replaceability of individual components will naturally be lost.

What is claimed is:

1. A method of assembling a plurality of wire-ended, electrical components into a module, which method includes the steps of positioning two notched, locating racks opposite one another with their notches uppermost; placing at least one wire-ended electrical component between said locating racks so that its wire ends lie in oppositely aligned notches the wire ends supported in each rack projecting beyond that side of the rack facing away from the component; supporting two further notched, locating racks, notches uppermost, above the two first-mentioned racks and spaced apart therefrom to form two stacks of individually supported racks; placing at least one further wire-ended, electrical component between said two further locating racks so that its wire-ends lie in oppositely aligned notches in said further racks, the wire end supported in each of said further racks projecting beyond that side of the rack facing away from the further electrical component; moving said stacks away from each other until the wire ends supported in the racks thereof are at most just projecting beyond the stacks; positioning a pair of apertured mounting plates on opposite sides of said stacks facing away from the supported electrical components to receive in the apertures of said plates those wire ends supported in said stacks; moving said mounting plates in the direction of said stacks until those wire ends supported in said stacks pass through the apertures in said mounting plates; and moving the mounting plates and racks to predetermined positions.

2. A method as defined in claim 1, in which the movement of both said mounting plates is effected simultaneously.

3. A method as defined in claim 1, in which the movement of both said mounting plates is effected successively.

4. A jig for assembling a plurality of wire-ended, electrical components into a module in which, during assembly, the wire ends of the components are supported between two stacks of locating racks, the jig including a base member; a slide member movable along said base member; first guide means mounted on said slide member for supporting one of said stacks of locating racks, second guide means for supporting the other stack of racks, and support means associated with each guide means for individually supporting each rack of a stack.

5. A jig for assembling a plurality of wire-ended, electrical components into a module in which, during such assembly, the wire ends of the components are supported in first and second stacks of locating racks, the jig including a base member; first and second members slidably mounted on said base member for movement towards and away from each other; first and second guide means mounted on said first and second slide members respectively, for supporting said first and second stacks of locating racks respectively; and support means associated with each guide means for locating the racks in each stack at a predetermined distance from one another so as to leave free space between the racks.

6. A jig according to claim 5 in which said support means comprise pins adapted to engage with the locating racks.

7. A jig for assembling a plurality of wire-ended, electrical components into a module in which the wire ends of the components are supported, at least during assembly, between two stacks of locating racks and which has an apertured mounting plate, on that side of one stack facing away from the supported electrical components, through the apertures of which plate extend those wire ends supported in said one stack, the jig including a base member; a slide member movable along said base member; first guide means mounted on said slide member for supporting a first stack of locating racks; second guide means for supporting a second stack of locating racks; support means associated with each guide means for locating the racks of each stack at a predetermined distance from one another so as to leave free space between the racks; and carrier means for carrying said apertured mounting plate, said carrier being mounted on said base member and adapted for to and fro movement with respect to said slide member.

8. A jig for assembling a plurality of wire-ended, electrical components into a module in which the wire ends of the components are supported, at least during assembly, between first and second stacks of locating racks and which has an apertured printed circuit plate disposed at that side of one of said stacks facing away from the components, the wire ends supported in said one stack projecting through the stack and extending through the apertures in said printed circuit plate for connection to the printed circuit on the plate, the jig including a base member; first and second members slidably mounted on said base member for movement towards and away from each other; first and second pairs of apertured uprights mounted on said first and second slide members respectively to support the racks in each stack; pins for extending through the apertures in said uprights to engage with and individually support racks in said stacks; and carrier means for carrying said apertured printed circuit plate, said carrier means being mounted on said base member and being adapted for to and fro movement with respect to one of said slide members.

References Cited by the Examiner

UNITED STATES PATENTS

| | | | |
|---|---|---|---|
| 2,921,550 | 1/1960 | Goodykoontz | 29—203 |
| 3,088,728 | 5/1963 | Sanborn | 269—40 |

JOHN F. CAMPBELL, *Primary Examiner.*

WILLIAM I. BROOKS, *Examiner.*